United States Patent
Nash

[19]
[11] Patent Number: 5,905,663
[45] Date of Patent: May 18, 1999

[54] MINIMAL CIRCUIT FOR DETECTING LOSS OF PRECISION IN FLOATING POINT NUMBERS

[75] Inventor: Mary Louise Nash, Fort Collins, Colo.

[73] Assignee: Hewlett-Packard Company, Palo Alto, Calif.

[21] Appl. No.: 08/867,452

[22] Filed: Jun. 2, 1997

[51] Int. Cl.$^6$ .................................................... G06F 7/38
[52] U.S. Cl. ............................ 364/745.04; 364/715.03; 364/748.04; 364/718
[58] Field of Search ................ 364/718, 715.03, 364/748.05, 745.04, 748.03, 715.04, 748, 748.01, 748.02; 341/50

[56] References Cited

U.S. PATENT DOCUMENTS

| | | | |
|---|---|---|---|
| 5,161,117 | 11/1992 | Waggener, Jr. ...................... | 364/715.03 |
| 5,268,855 | 12/1993 | Mason et al. ....................... | 364/748.19 |
| 5,304,994 | 4/1994 | Heikes ..................................... | 341/50 |
| 5,317,527 | 5/1994 | Britton et al. ....................... | 364/715.04 |
| 5,487,022 | 1/1996 | Simpson et al. ..................... | 364/715.04 |
| 5,506,797 | 4/1996 | Koshiba .................................... | 364/718 |
| 5,627,773 | 5/1997 | Wolrich et al. ..................... | 364/715.03 |
| 5,742,537 | 4/1998 | Wolrich et al. ..................... | 364/748.05 |
| 5,761,103 | 3/1995 | Oakland et al. .................... | 364/748.03 |
| 5,781,464 | 12/1995 | Mehta ................................. | 364/748.01 |
| 5,801,978 | 2/1996 | Baydatch ........................... | 364/745.04 |

OTHER PUBLICATIONS

"IEEE std. for Binary Floating–point arithmetic"; IEEE std. 754–1985; pp. 8–12.

*Primary Examiner*—Hassan Kizou
*Assistant Examiner*—Rijue Mai
*Attorney, Agent, or Firm*—Alexander J. Neudeck

[57] ABSTRACT

A circuit and method for detecting when converting a number from a floating point format to a fixed point format will result in a loss of precision. All bits but the most significant bit of the exponent of the floating point number are inverted. This results in a transformed exponent that is input to a comparator. The mantissa of the floating point number is input to a signed trailing one detector (STOD). The STOD outputs a signed number that indicates the bit position of the least significant logical "1" in the mantissa, plus a bias number. The bias number is chosen to be the number of bits in the fractional part of the fixed point format minus the number of bits in the mantissa. The output of the STOD is input to the other input of the comparator. The output of the comparator indicates whether or not a loss of precision occurs.

14 Claims, 2 Drawing Sheets

MINIMAL CIRCUIT FOR DETECTING LOSS OF PRECISION IN FLOATING POINT NUMBERS

FIELD OF THE INVENTION

The present invention relates generally to a circuit and method for determining if precision is lost when converting a number in floating point format to fixed point format. In particular, the present invention provides a circuit and method that detects when a floating point number must be truncated to convert it to a fixed point format.

BACKGROUND OF THE INVENTION

In a computer, or other digital electronic device, data is typically stored as a series of binary '1's and '0's defining a word, where each binary word is stored in a memory such as a register. Data may be stored in fixed point format wherein the position of the radix point is fixed with respect to one end of the word. Data may also be stored in floating point format wherein each number is represented as a sign, a signed exponent, and a significand, where the numerical value, if any, is the signed product of its significand and the radix raised to the power of the exponent. Several floating point formats are disclosed in the IEEE (Institute of Electrical and Electronics Engineers) Standard for Binary Floating Arithmetic (ANSI/IEEE Std. 754-1985) which is hereby incorporated by reference.

The IEEE single precision format is shown in FIG. 1. This format is comprised of 32 bits, B0 to B31. The mantissa or fractional part 102 comprises 23 bits, B0 to B22. These bits are the significant digits of the number to be represented. The mantissa has a leading '1' that is implied by the format so the actual precision of the mantissa is 24 bits. The exponential part 104 comprises 8 bits, B23 to B30, and is a power of 2 multiplier applied to the mantissa, 102. The exponent is "biased" by adding 127. Therefore, if e is the value of the exponent field, then E is the actual value of the exponent for the number represented, e=E+127. Thus, an exponent field of "01111111" corresponding to bits B30 to B23, respectively, represents a numerical exponent of zero. A sign bit, 106, is included as the most significant bit (MSB) B31 of the entire 32-bit word and identifies the sign of the mantissa 102. Similar fields, and a corresponding exponent bias are defined for the IEEE double precision floating point format.

To convert a number in IEEE floating point format to a fixed point format, the exponent bias is subtracted from the value of the exponent field. The resulting unbiased exponent value, E, is then used to shift the mantissa (including the implied leading '1') by E bits. A positive value of E means a left shift is necessary. A negative value of E means a right shift is necessary. A left shift which is greater than or equal to the number of bits of integer information in the fixed point number results in an overflow. A right shift which results in the rightmost '1' of the mantissa ending up in a bit position that is farther right than the last bit in the fractional portion of the fixed point format results in a loss of precision. For example, take a floating point number that has a mantissa (including implied leading '1') of "1.00100000" and convert it to a fixed point format that has 3 bits of integer information and 5 bits of fractional information. if the unbiased exponent is −1, the resulting fixed point number would be "000.10010". However, if the unbiased exponent is −3, the resulting fixed point number would be "000.00100". The loss of precision results from discarding the rightmost '1'. The loss of precision can be illustrated by converting the resulting fixed point number "000.00100" back into floating point format. The conversion back to floating point format results in a mantissa of "1.00000000". This is not the same as the original floating point number because a loss of precision has occurred.

The accuracy of arithmetic operations performed by digital electronic devices can depend on detecting a loss of precision when converting a number from a floating point format to a fixed point format. Therefore, there is a need to for a versatile method and circuit capable of determining when converting a number from a floating point format to a fixed point format results in a loss of precision. Furthermore, determining when a trailing bit will be lost during conversion to a fixed point format is useful when rounding numbers. Such a circuit should be adaptable to conversions between a variety of floating point and fixed point formats. Such a circuit should also operate with minimal delay, be simple and inexpensive to implement, and be reliable.

SUMMARY OF THE INVENTION

According to the present invention, there is provided a circuit which operates on a floating point number. The circuit is comprised of a plurality of inverters that invert each bit except the most significant bit (MSB) of the biased exponent. The result of this transformation is a transformed exponent that is a two's complement number, A, that has the same magnitude, but opposite sign, as the unbiased exponent. The mantissa is provided to a signed trailing one detector with a bias. The output of the signed trailing one detector is a binary number, B, which indicates the bit position of the rightmost "1" of the mantissa plus or minus a predetermined bias number. The bias of the signed trailing one detector is determined by the number of bits in the mantissa and the number of bits in the fractional part of the fixed point format. The signed output of the biased signed trailing one detector, B, and the transformed exponent, A, are compared. If A is greater than B, the result must be truncated to convert from floating point to fixed point format. This truncation causes a loss of precision.

DETAILED DESCRIPTION

Figure 1:
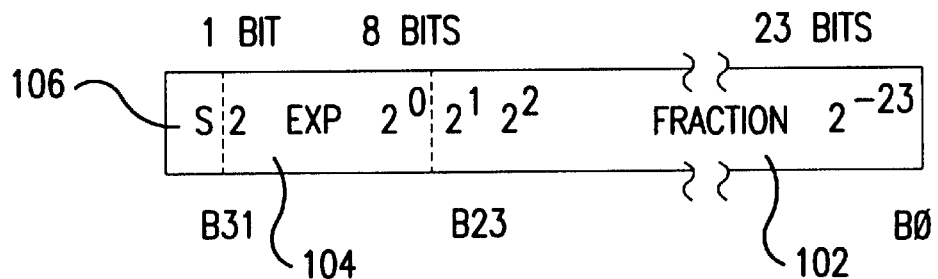
FIG. 1 illustrates the IEEE single precision floating point format.
Figure 2:
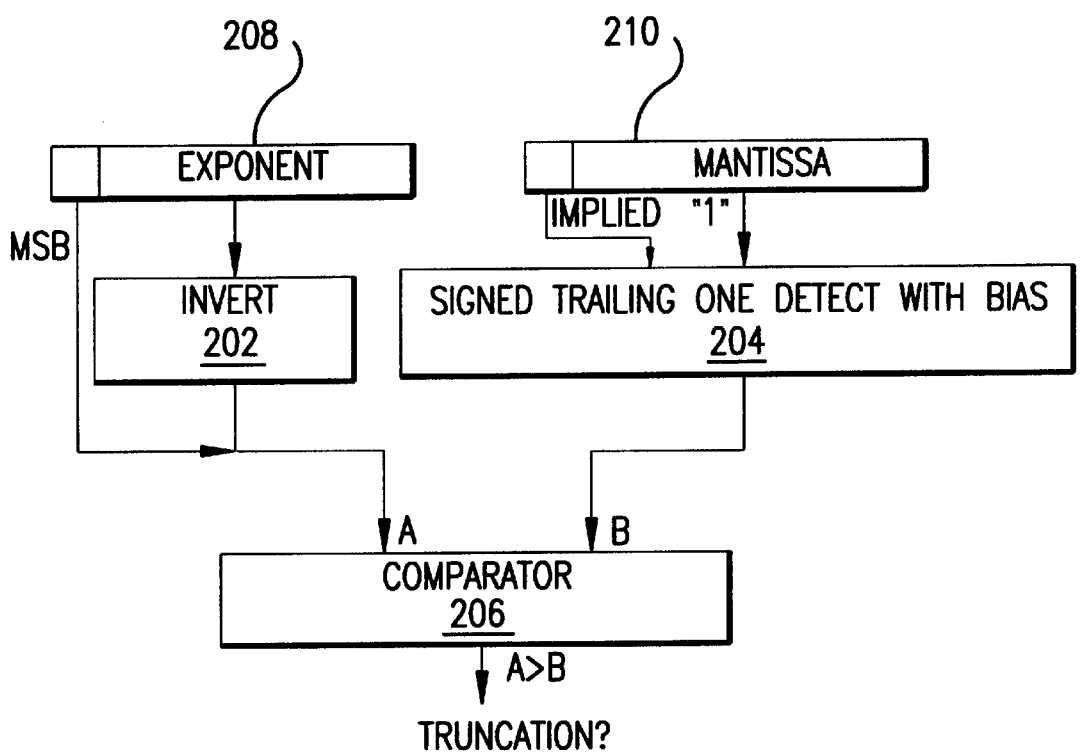
FIG. 2 is a block diagram illustrating the loss of precision detector.

FIG. 2 illustrates the loss of precision detector of the present invention. As inputs, the loss of precision detector takes the mantissa 210 and the exponent 208 of a floating point number. In two preferred embodiments, the floating point number is in IEEE single precision or IEEE double precision format, respectively. However, the mantissa 210 and exponent 208 may have an arbitrary number of bits. The exponent 210 should be in a format that has a bias, B, where $B=2^{N-1}-1$. N is the number of bits in the exponent. All but the most significant bit (MSB) of the exponent 208 is input to a set of inverters 202 which invert these bits, respectively. These inverted bits, plus the MSB of the exponent is fed to one input, A, of a comparator 206.

The mantissa including the implied leading '1' 210 is fed to a signed trailing one detector with a bias (STOD) 204. A signed trailing one detector outputs a signed number which indicates the bit number of the rightmost '1' of the mantissa plus or minus a bias. For example, if the rightmost '1' in the mantissa is in the third bit from the right, and the bias was zero, the STOD would output a 2. Given the same example, but a bias of −2, the STOD would output a 0. Also given the same example, but a bias of −7, the STOD would output a negative five (−5). An example of a circuit which may be adapted for use as a signed trailing one detector 204 is disclosed by the likes, U.S. Pat. No. 5,304,994 "Minimal Delay Leading One Detector With Result Bias Control" which is hereby incorporated by reference. One embodiment of the present invention uses the signed trailing one detector illustrated in FIG. 3.

The bias chosen depends on the number of mantissa bits, and the number of fraction bits in the resulting fixed point format. The bias of the signed trailing one detector is chosen as F-M, where F is the number of fractional bits in the fixed point format and M is the number of bits in the mantissa. For example, if the number of fractional bits is 16, and the conversion is from IEEE single point format that has 23 fractional mantissa bits, then the bias of the signed trailing one detector would be chosen to be −7. The output of the signed trailing one detector with bias 204 is input to the other input, B, of the comparator 206.

The output of the comparator 206 indicates whether the result must be truncated, with an associated loss of precision. If the A input of the comparator is greater than the biased output of the signed trailing one detector on the B input of the comparator, then the result must be truncated.

Figure 3:
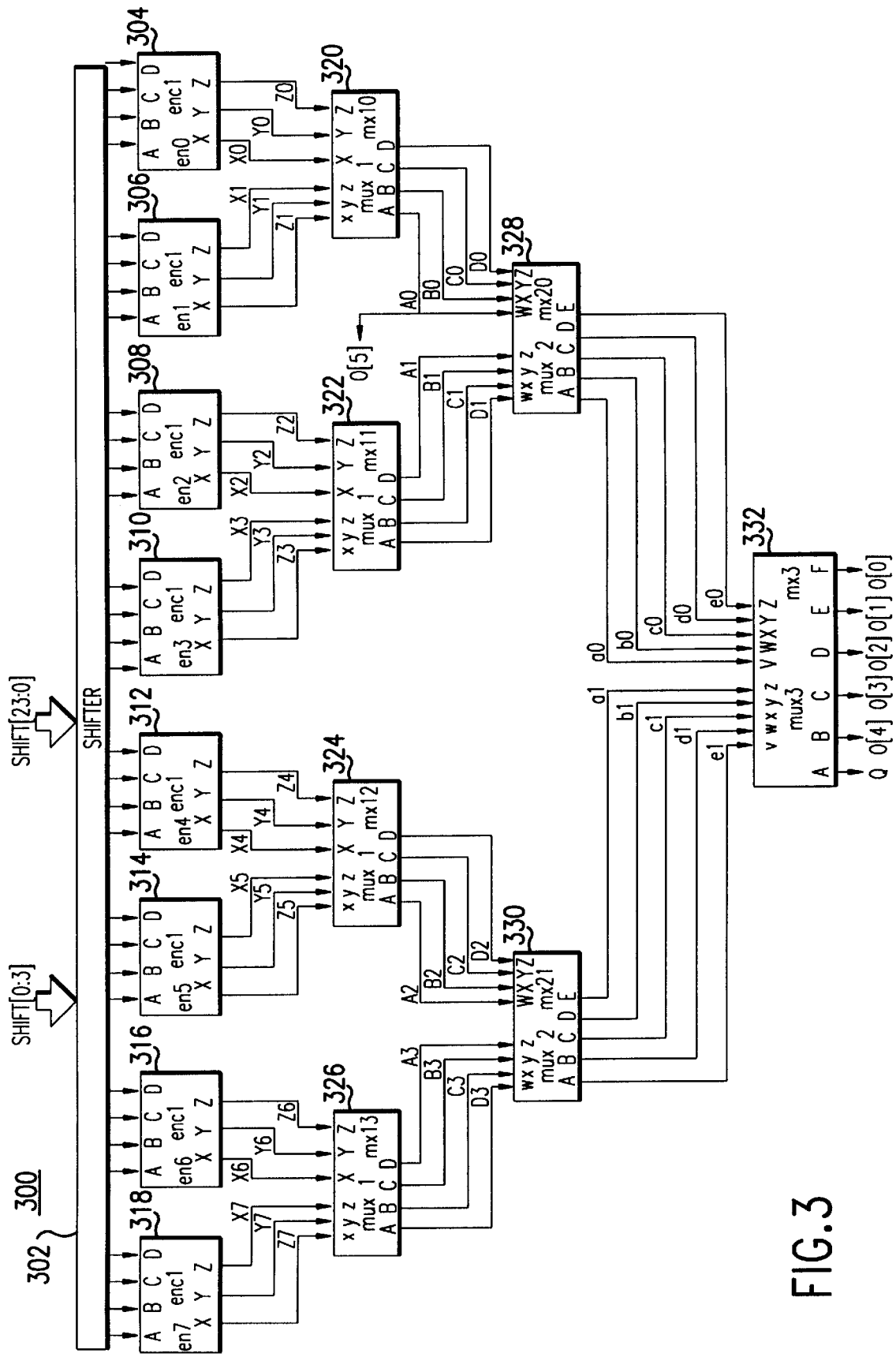
FIG. 3 illustrates a signed trailing one detector (STOD) with a variable bias.

A signed trailing one detector (STOD) 300 with a variable bias is illustrated in FIG. 3. The mantissa including the implied leading '1' 210 is input to shifer 302 as signals input [23:0]. The shifter aligns the input bits with the inputs to encoders 304, 306, 308, 310, 312, 314, 316, and 318. The shifter does not change the order of the input bits, rather, it just aligns them with the appropriate encoder inputs, filling the extra outputs with '0's. The number of bits the shifter shifts the input bits may be variable and is set by the input signals shift[0:3]. A variable bias is desirable to allow the circuit to detect a loss of precision when converting to and from various different floating and fixed point formats. Encoder 304 takes the 4 least significant bits from the output shifter, encoder 306 takes the next 4 more significant bits, etc. through encoder 318 which takes the most significant 4 bits of the output of the shifter. The, alignment of the input bits by the shifter sets the bias value for the STOD. For example, the rest of the STOD 300 not including the shifter 302 is constructed to have an inherent bias of negative eight (−8). By left shifting input[23:0] one bit left and filling in '0's on the right so that input[0] aligns with input C of encoder 304, the STOD will have a bias of 8+1=−7. Likewise, a left shift of eight bits will produce a bias of 0. Because there are eight encoders 304, 306, 308, 310, 312, 314, 316, and 318, each with four inputs, a left shift of eight is the maximum allowable left shift without losing data. A left shift of greater than eight bits would cause, at least, the implied '1' to be lost. Therefore, the STOD 300 shown in FIG. 3 has a variable bias from 0 to −8.

In another embodiment, if a variable bias is not necessary, the bias may be set by the construction of the circuit. For example, input[0] could be aligned with input B of encoder 304 and inputs C and D of encoder 304 set to a permanent '0' to produce a fixed bias of −6. Furthermore, the STOD 300 in FIG. 3 not including the shifter 302 is constructed to have an inherent bias of −8. This could easily be modified to produce a different inherent bias and a different range of variable biases.

In FIG. 3, the outputs of shifter 302 are coupled to the inputs of encoders 304, 306, 308, 310, 312, 314, 316, and 318. The truth table for each of the encoders 304, 306, 308, 310, 312, 314, 316, and 318 is shown in Table 1, below.

TABLE 1

| Inputs ABCD | Outputs XYZ |
|---|---|
| ???1 | 100 |
| ??10 | 101 |
| ?100 | 110 |
| 1000 | 111 |
| 0000 | 011 |

The outputs "XYZ" are shown if FIG. 3 as X0, Y0, and Z0 for encoder 304, as X1, Y1, and Z1 for encoder 306, as X2, Y2, and Z2 for encoder 308, as X3, Y3, and Z3 for encoder 3R0, as X4, Y4, and Z4 for encoder 312, as X5, Y5, and Z5 for encoder 314, as X6, Y6, and Z6 for encoder 316, and as X7, Y7, and Z7 for encoder 318.

The most significant bit of the encoded output indicates whether or not any logic '1' appears in the input. Thus, if "Y" of the encoded output is a '1', a logic '1' appears somewhere in the group of bits received at the inputs ABCD of the corresponding encoder. If "X" of the encoded output is a '0', there is no logic '1' among the bits received at the inputs ABCD. The remaining bits of the encoded output, "Y" and "Z", indicate the position of the trailing '1' if a trailing '1' is among the received inputs bits. When the "X" output is a '0', then the value of the remaining two outputs "Y" and "Z" don't matter because there is no logic '1' among the bits received at the input. Because these bits don't matter, any arbitrary output may be chosen for them when the "X" output is a logic '0'.

The STOD also comprises a binary tree of multiplexors. The 32-bit STOD 300 shown in FIG. 3 requires three successive levels of multiplexors. The first level comprises multiplexors 320, 322, 324, and 326. The "A" output of multiplexor 320 is used as sign bit O[5] of the output O[5:0] because an inherent bias of −8 was desired. Other inherent biases would dictate that a different signal may need to be chosen to use as the sign bit O[5]. The second level comprises multiplexors 328 and 330. The third level comprises multiplexor 332. The first level multiplexors 320, 322, 324, and 326 reduce the eight 3-bit encoded outputs, X0, Y0, Z0 through X7, Y7, Z7, into four 4-bit outputs A0, B0, C0, D0 through A3, B3, C3, D3, respectively. The second level multiplexors 328 and 330 reduce the four 4-bit outputs A0, B0, C0, D0 through A3, B3, C3, D3 from the first level multiplexors to two 5-bit outputs a0, b0, c0, d0, e0 and a1, b1, c2, d1, e1. The third level multiplexor 332 reduces the two 5-bit outputs a0, b0, c0, d0, e0 and a1, b1, c2, d1, e1 to a single 5-bit output O[4:0]. Because the implied "1" of the mantissa is always input to the STOD 300, the "A" output of multiplexor 332 is always a logical '1' so it may be ignored. If the implied '1' was not input to the STOD, the "A" output of multiplexor 332 would be a '0' if there were no '1's at all on the inputs to the STOD.

The truth table for the first level multiplexors 320, 322, 324, and 326 is given in Table 2, below.

TABLE 2

| Inputs | | Outputs |
|---|---|---|
| xyz | XYZ | ABCD |
| ??? | 1IJ | 10IJ |
| 1ij | 0?? | 11ij |
| 0ij | 0?? | 00ij |

Note the last line of the truth table when both inputs "x" and "X" are '0'. In this case, the outputs "C" and "D" would mirror the inputs "y" and "z", respectively. However, by looking at Table 1, whenever the output "X" from the encoder is a '0', the outputs "Y" and "Z" are both '1's. Therefore, given the way the STOD in FIG. 3 is constructed, the inputs "y" and "z" will both be the arbitrarily chosen value of '1' when "x" is a '0' and those '1's will be passed on to the "C" and "D" outputs.

The truth table for the second level multiplexors 328 and 330 is given in Table 3, below.

TABLE 3

| Inputs | | Outputs |
|---|---|---|
| wxyz | WXYZ | ABCDE |
| ???? | 1IJK | 11IJK |
| 1ijk | 0??? | 10ijk |
| 0ijk | 0??? | 00ijk |

The truth table for the third level multiplexor 332 is given in Table 4, below.

TABLE 4

| Inputs | | Outputs |
|---|---|---|
| vwxyz | VWXYZ | ABCDEF |
| ????? | 1IJKL | 1IIJKL |
| 11jkl | 0???? | 10jkl |
| 10jkl | 0???? | 11ijkl |
| 0ijkl | 0???? | 00ijkl |

Note the last line of the truth table when both inputs "v" and "V" are 'V'. In this case, the outputs "C", "D", "E" and "F" would mirror the inputs "w", "x", "y", and "z", respectively. Also note that since the implied leading '1' of the mantissa is always input to the STOD, the "A" output of multiplexor 332 will always be a '1'. Accordingly, multiplexor 332 may be simplified to eliminate the "A" output and the last line of Table 4.

It should also be understood that the present invention could easily be modified for detecting a loss of precision when converting from other floating point formats with other biases. Furthermore, the STOD in the present invention could be modified to incorporate other inherent biases other than −8. Although a specific embodiment of the invention has been described and illustrated, the invention is not to be limited to the specific forms or arrangements of parts so described and illustrated. The invention is limited only by the claims.

I claim:

1. A circuit for detecting a loss of precision when converting a number in a floating point format to a fixed point format, the floating point format having an exponent comprised of a most significant bit and a first plurality of bits and a mantissa comprised of a second plurality of bits, the circuit comprising:

a plurality of inverters that invert the first plurality of bits producing a transformed exponent;

a signed trailing one detector (STOD) receiving the second plurality of bits whereby the signal trailing one detector is operative to provide a STOD output that is a bias summed with a number that is indicative of the bit position in the mantissa of the least significant occurrence of a bit with a selected characteristic; and a comparator having a comparator output, a first comparator input and a second comparator input, the transformed exponent being coupled to the first comparator input, the STOD output being coupled to the second comparator input, and the comparator output being indicative of whether the first comparator input is greater than the second comparator input.

2. The circuit of claim 1 wherein the selected characteristic comprises one of:
   a) a logical "1";
   b) a logical "0".

3. The circuit of claim 2, wherein the fixed point format has a plurality of fractional bits and wherein the bias is equal to the number of bits in the plurality of fractional bits minus the number of bits in the plurality of mantissa bits.

4. The circuit of claim 3, wherein the floating point format is IEEE single precision format.

5. The circuit of claim 3, wherein the floating point format is IEEE double precision format.

6. The circuit of claim 3, wherein the bias is set by an input to the STOD.

7. The circuit of claim 3, wherein the bias is determined by the wiring of the STOD.

8. A method for detecting a loss of precision when converting a number in a floating point format to a fixed point format, the floating point format having an exponent comprised of a most significant bit and a first plurality of bits and a mantissa comprised of a second plurality of bits, comprising the steps of:

a) inverting the first plurality of bits to generate a transformed exponent;

b) determining a bit number that is indicative of the position of the least significant bit in the mantissa that has a specified characteristic;

c) summing the bit number with a bias to generate a biased bit number; and d) comparing the transformed exponent with the biased bit number thereby detecting a loss of precision when converting a number in the floating point format to the fixed point format.

9. The method of claim 8 wherein the selected characteristic comprises one of:
   a) a logical "1";
   b) a logical "0".

10. The method of claim 9, wherein the fixed point format has a plurality of fractional bits and wherein the bias is equal to the number of bits in the plurality of fractional bits minus the number of bits in the plurality of mantissa bits.

11. The method of claim 10, wherein the floating point format is IEEE single precision format.

12. The method of claim 10, wherein the floating point format is IEEE double precision format.

13. The method of claim 10, wherein the bias is set by an input to the STOD.

14. The method of claim 10, wherein the bias is determined by the wiring of the STOD.

* * * * *